(12) United States Patent
Song et al.

(10) Patent No.: US 7,527,398 B2
(45) Date of Patent: May 5, 2009

(54) FLAT PANEL DISPLAY

(75) Inventors: Young-Woo Song, Suwon-si (KR); Young-Rag Do, Suwon-si (KR); Yoon-Chang Kim, Suwon-si (KR); Sang-Hwan Cho, Suwon-si (KR); Ji-Hoon Ahn, Suwon-si (KR); Joon-gu Lee, Suwon-si (KR); So-Young Lee, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 326 days.

(21) Appl. No.: 11/097,260

(22) Filed: Apr. 4, 2005

(65) Prior Publication Data

US 2005/0275327 A1    Dec. 15, 2005

(30) Foreign Application Priority Data

Apr. 3, 2004    (KR)    ................. 10-2004-0023175

(51) Int. Cl.
*F21V 5/00*    (2006.01)
(52) U.S. Cl. ................. 362/330; 362/331; 362/617; 362/620
(58) Field of Classification Search ................. 362/330, 362/331, 620, 617
See application file for complete search history.

(56) References Cited

U.S. PATENT DOCUMENTS

| | | | | |
|---|---|---|---|---|
| 5,442,523 A | * | 8/1995 | Kashima et al. | 362/617 |
| 6,091,547 A | * | 7/2000 | Gardiner et al. | 359/625 |
| 6,273,577 B1 | * | 8/2001 | Goto et al. | 362/615 |
| 6,661,479 B2 | * | 12/2003 | Taniguchi et al. | 362/600 |
| 2002/0097496 A1 | * | 7/2002 | Lu | 359/628 |
| 2003/0234900 A1 | * | 12/2003 | Kim | 349/112 |

FOREIGN PATENT DOCUMENTS

| | | |
|---|---|---|
| CN | 1467511 | 1/2004 |
| JP | 09-073983 | 3/1997 |
| JP | 09-326297 | 12/1997 |
| JP | 10-223367 | 8/1998 |
| JP | 2002-043054 | 2/2002 |
| JP | 2003-197364 | 7/2003 |
| JP | 2004-039388 | 2/2004 |
| JP | 2004-058448 | 2/2004 |
| JP | 2004-070309 | 3/2004 |
| KR | 1020030096509 A | 12/2003 |

OTHER PUBLICATIONS

Chinese Office Action dated May 23, 2008.

* cited by examiner

*Primary Examiner*—Sandra L. O'Shea
*Assistant Examiner*—Meghan K. Dunwiddie
(74) *Attorney, Agent, or Firm*—H.C. Park & Associates, PLC

(57) ABSTRACT

A flat panel display can include a transparent substrate, a light emitting device formed on a surface of the transparent substrate, and a prism sheet formed on the other surface of the transparent substrate and having a plurality of polygonal protruding members having lengthwise axes parallel to one another to direct light output from the light emitting device in a predetermined direction. The sum of the thickness of the transparent substrate and the thickness of a portion of the prism sheet excluding the polygonal protruding members can be about 0.1 to about 0.5 mm.

11 Claims, 14 Drawing Sheets

FLAT PANEL DISPLAY

CROSS-REFERENCE TO RELATED PATENT APPLICATIONS

This application claims the benefit of Korean Patent Application No. 10-2004-0023175, filed Apr. 3, 2004, which is incorporated herein in its entirety by reference.

BACKGROUND OF THE INVENTION

1. Field of the Invention

The present invention relates, for example, to a flat panel display. More particularly it relates, for example, to a flat panel display that can improve light coupling efficiency of a light emitting device and help to prevent loss of image sharpness.

2. Description of the Related Art

Light coupling efficiency of a flat panel display using a light emitting device is determined by the refractive index of each layer from the light emitting layer to the outside of the flat panel display. Light coupling efficiency is lower if light exits in an undesired direction when light is transmitted from a transparent substrate having a higher refractive index to air having a lower refractive index. Also, light coupling efficiency is lower when light is incident on a boundary surface between the substrate and air at an angle greater than the critical angle, the light is totally reflected (not transmitted outwardly).

In a conventional flat panel display using a light emitting device as shown in FIG. 1, the light coupling efficiency when light emitted from the light emitting device 1 is transmitted to air in a transparent substrate 2 is based on the formula $\frac{1}{2}(N_{out}/N_{in})^2$, in which N is a refractive index.

When light coupling efficiency is calculated based on the above formula for a case in which a transparent glass substrate is used light coupling efficiency is about 21.64%. This is because the refractive indexes of the transparent glass substrate and the air are about 1.52 and 1.00, respectively. Thus, 70% or more of the light incident on the transparent substrate 2 is lost in the transparent substrate 2. Also, since light emitted from the light emitting device travels in an undesired direction, there have been various efforts to solve this problem.

One of the efforts was to increase the supply voltage, and thereby improve brightness. However, this requires increasing the capacity of, or shortening the duration of use of the battery (if a battery is used to power the device). If battery capacity is increased, this can increase the weight of the device as a whole. Therefore, the some references have attempted to improve brightness while lowering the supply voltage.

Japanese Patent Publication No. hei 9-73983 discloses an electroluminescent (EL) lighting device in which an acryl resin based prism lens sheet (on which a plurality of prisms having lengthwise axes parallel to one another are formed) is installed on a light emitting surface of an EL sheet. Total reflection is reduced by allowing light incident on an interface between a transparent substrate and air at an angle greater than the critical angle to have an incident angle less than the critical angle at each side of the prism lens. Brightness in a predetermined direction is increased by allowing light to exit in the predetermined direction. However, some light is lost due to total reflection in the prism lens. Additionally, the sharpness of the image is degraded by overlapping of the image.

To solve the problem that total reflection exists in the prism lens, Korean Patent Publication No. 2003-0096509 discloses a prism sheet. The prism sheet includes a first surface on which light emitted from a light source is incident, a second surface through which light incident from the first surface exits. The second surface including a plurality of polygonal protruding members having lengthwise directional axes parallel to one another. Each of the protruding members has at least one first side forming an angle of about 65°-75° with a line perpendicular to the first surface and at least one second side adjacent to the first side and at an angle of about 40°-60° with the line perpendicular to the first surface. Such a configuration can help to reduce total reflection in the prism.

However, the above invention is not used for the light emitting device but for the backlight. When the invention is used for the flat panel display using a light emitting device, the image sharpness deteriorates because of the overlapping of the image.

SUMMARY OF THE INVENTION

The present invention provides a flat panel display that not only improves light coupling efficiency and brightness, but also prevents a sharpness deterioration occurring when an image generated by a light emitting device passes through a prism sheet.

The present invention provides, for example, a flat panel display including a light emitting device formed on a first surface of a transparent substrate and a prism sheet formed on a second surface of the transparent substrate. The prism sheet may have a plurality of polygonal protruding members having lengthwise axes parallel to one another. These members may function to direct light output from the light emitting device in a predetermined direction. The sum of the thickness of the transparent substrate and the thickness of the prism sheet excluding the polygonal protruding members may be about 0.1 to about 0.5 mm.

DETAILED DESCRIPTION OF THE INVENTION

Figure 1:
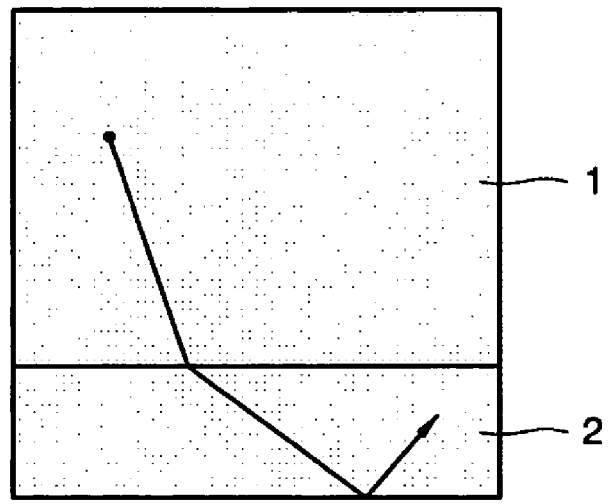
FIG. 1 is a cross-sectional view illustrating a state in which light of the conventional flat panel display using a light emitting device travels.
Figure 2:
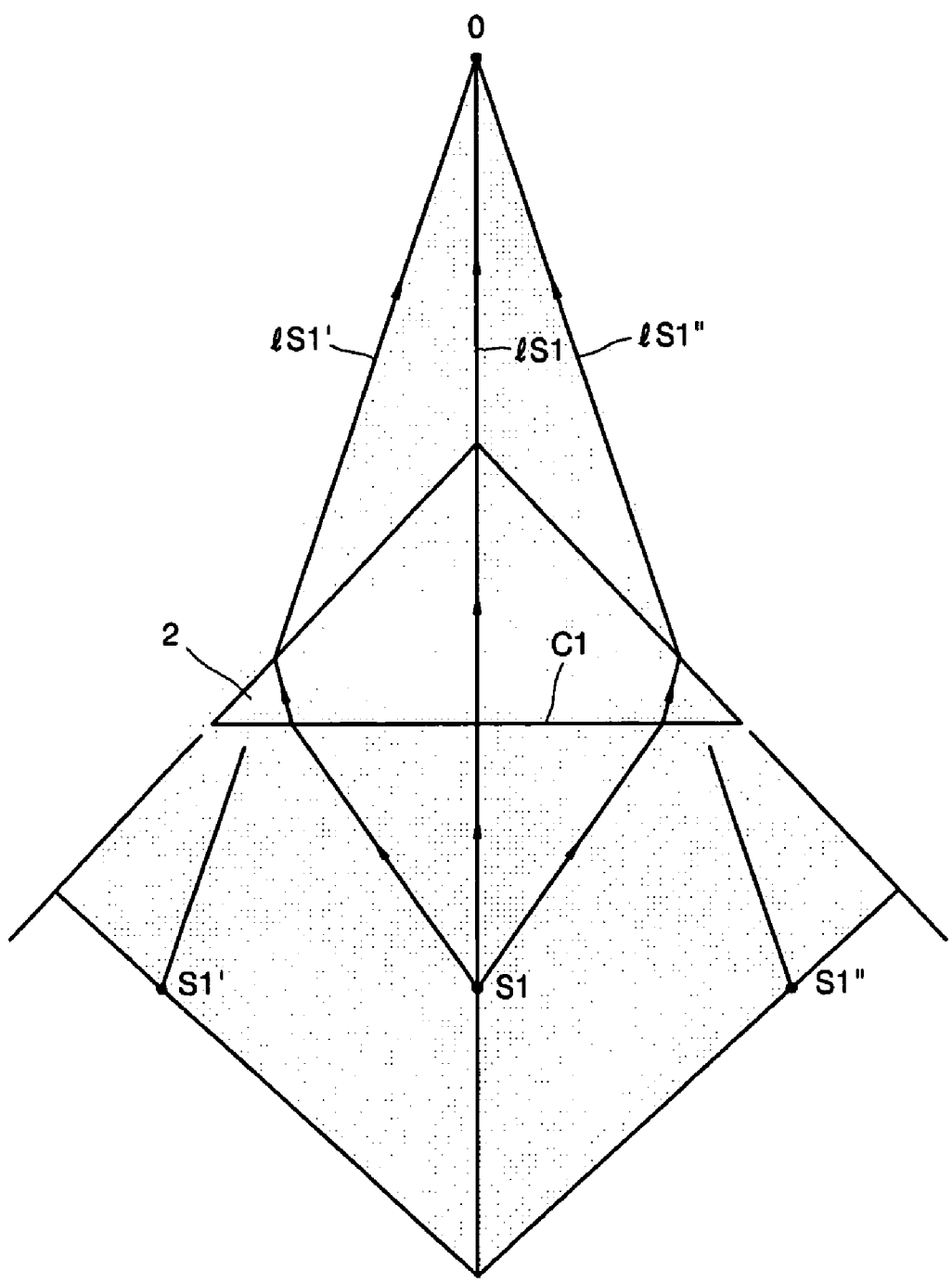
FIGS. 2 and 3 are views for explaining the operation of a prism in generating overlapped images.
Figure 3:
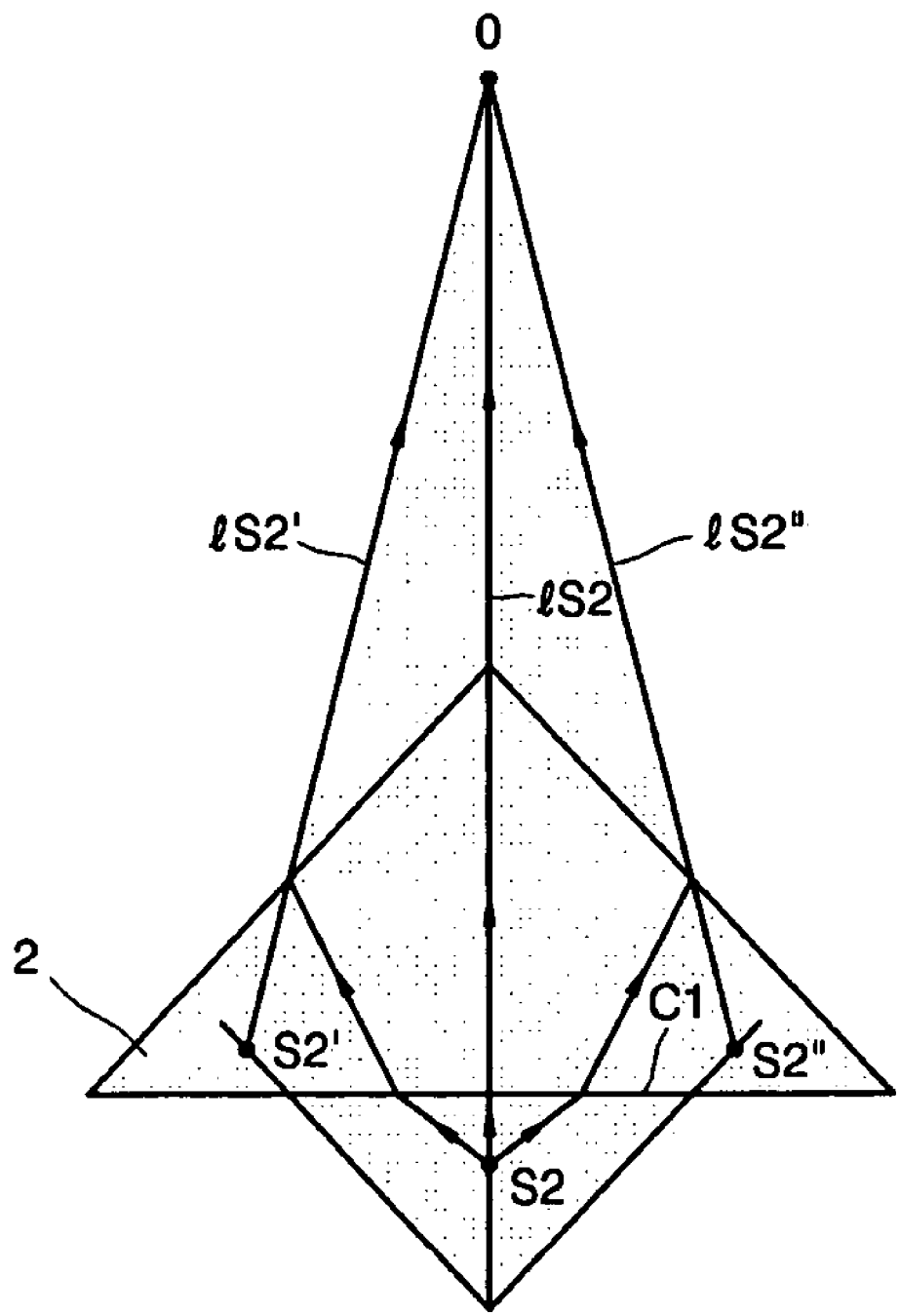

FIGS. 2 and 3 show optical paths and the positions of images in a triangular prism 2. As shown in FIG. 2, there may be substantially three optical paths S1, S1', and S1" from a light source S1 to an observation point O at the opposite side with respect to the prism 2. As a result, the light source S1 can appear to be three light sources S1, S1', and S1" when viewed from the observation point O.

The above problem does not matter when a prism sheet is disposed between liquid crystal and a backlight. This is because it is used there to improve brightness and collect the light from the backlight. However, when the prism sheet is used to improve brightness and collect light of an image generated by a light emitting device, the image can appear to be plural as described above, and sharpness of the image is lowered. These problems occur not only with a triangular prism but also with a polygonal protruding member by the same principle.

The prism 2 of FIG. 3 is the same as the prism 2 of FIG. 2 and the relative positions of the observation points O at the opposite sides of the prisms 2 of FIGS. 2 and 3 with respect to the prisms 2 are the same. However, the distance from a surface C1 of the prism 2 of FIG. 2 to the light source S1 is about 6 times of the distance from a surface C1 of the prism 2 of FIG. 3 to a light source S2.

Comparing FIGS. 2 and 3, an angle between the three light sources S1, S1', and S1" viewed from the observation point O in FIG. 2 is greater than an angle between three light sources S2, S2', and S2" viewed from the observation point O in FIG. 3. This is because, when an observer views an image at the same position, the images appear to be closer, the closer the light source is to the prism. This principle applies equally to a prism formed of polygonal protruding members. Thus, a sharper image can be obtained by sufficiently decreasing the distance between the light source and the prism such that the duplicate images are projected closer to one another.

Figure 4:
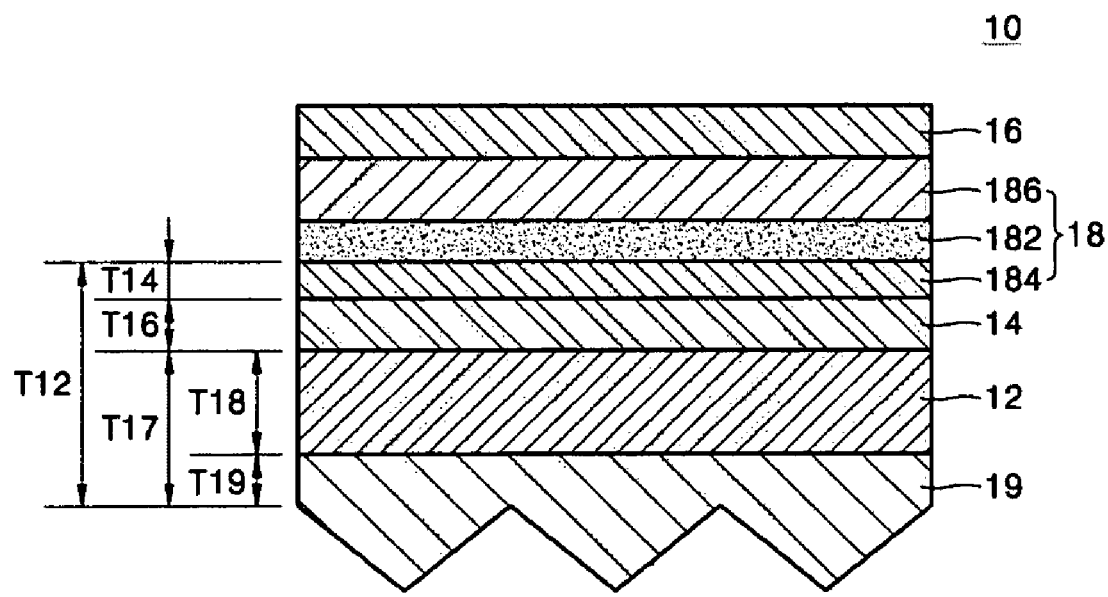
FIG. 4 is a cross-sectional view of a flat panel display of an embodiment of the present invention.
Figure 5:
FIG. 5 is an image when a prism sheet is applied to a substrate having a thickness of 0.1 mm.
Figure 6:
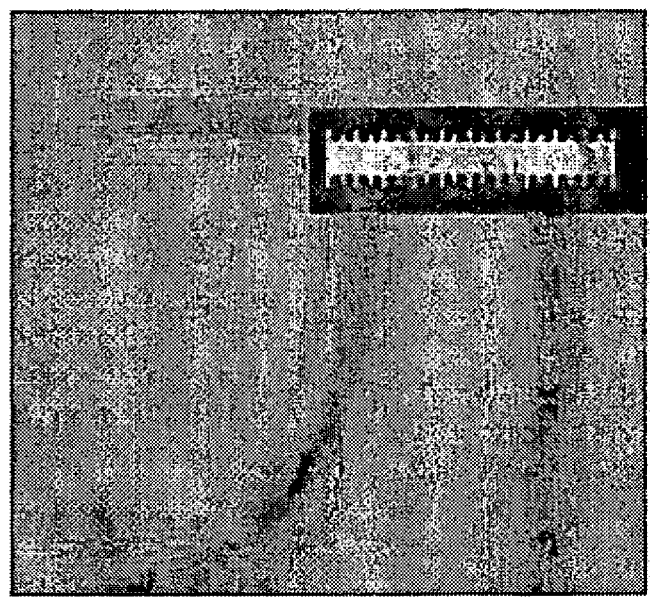
FIG. 6 is a microscopic image of a character when the prism sheet is applied to the substrate having a thickness of 0.1 mm.
Figure 7:
FIG. 7 is an image when the prism sheet is applied to a substrate having a thickness of 0.15 mm.
Figure 8:
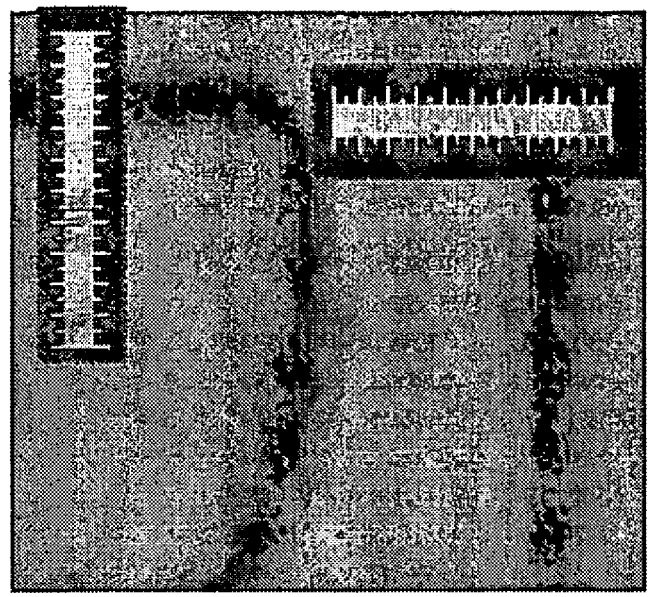
FIG. 8 is a microscopic image of a character when the prism sheet is applied to the substrate having a thickness of 0.15 mm.
Figure 9:
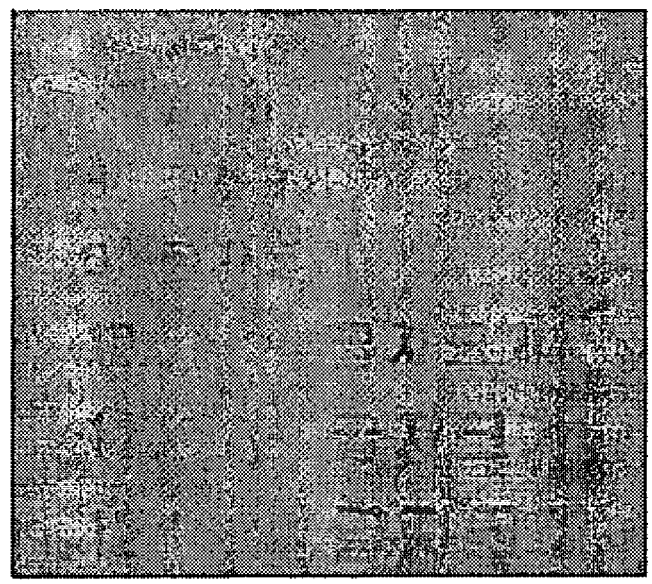
FIG. 9 is an image when the prism sheet is applied to a substrate having a thickness of 0.3 mm.
Figure 10:
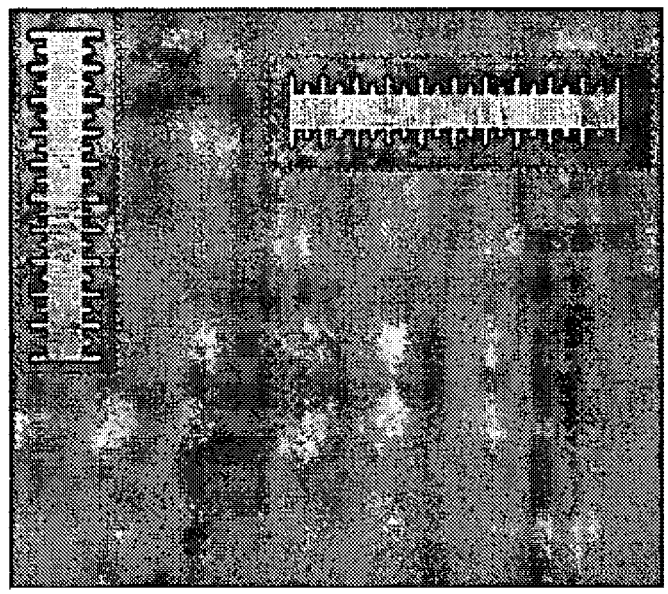
FIG. 10 is a microscopic image of a character when the prism sheet is applied to the substrate having a thickness of 0.3 mm.
Figure 11:
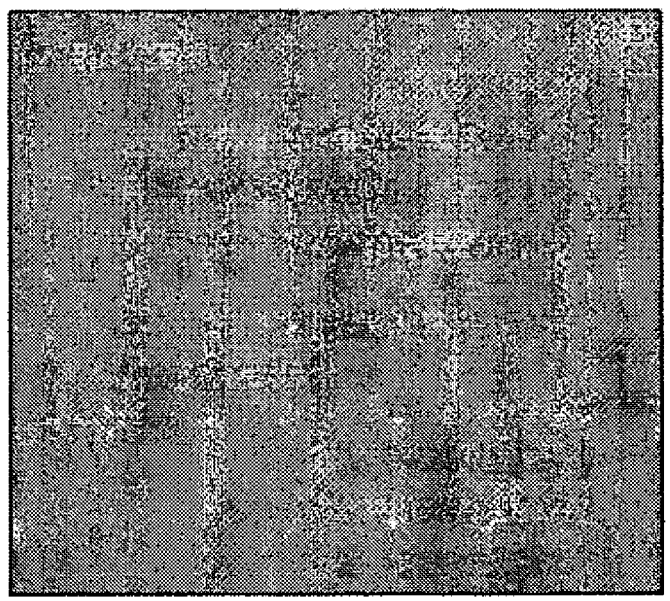
FIG. 11 is an image when the prism sheet is applied to a substrate having a thickness of 0.5 mm.
Figure 12:
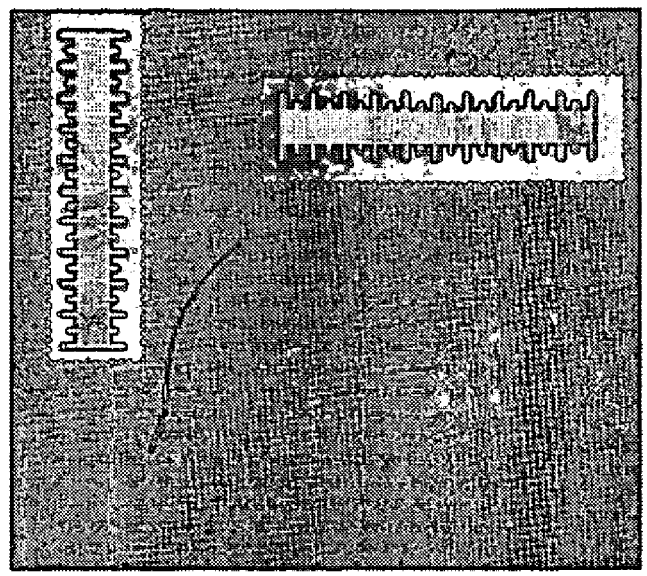
FIG. 12 is a microscopic image of a character when the prism sheet is applied to the substrate having a thickness of 0.5 mm.

FIG. 4 is a cross-sectional view of a flat panel display of a first embodiment of the present invention in which a light emitting device is an electroluminescence display. As shown in FIG. 4, in a flat panel display 10 of a first embodiment of the present invention, a first electrode layer 14 can be formed on a surface of a transparent substrate 12 formed of a transparent material. An intermediate layer 18 (including, for example, at least a light emitting layer 182) can be formed on the upper surface of the first electrode layer 14.

A second electrode layer 16 having a polarity different from that of the first electrode layer 14 can be formed on the upper surface of the intermediate layer 18. A prism sheet 19 can be formed on the other surface of the transparent substrate 12. A seal member (not shown) for sealing the first electrode layer 14, the intermediate layer 18, and the second electrode layer 16 from the outside can be further provided on the upper surface of the second electrode layer 16. In the following embodiments, seal members are omitted for ease of explanation.

The transparent substrate 12 may be a transparent glass substrate having $SiO_2$ as a main ingredient. Although not shown in the drawing, a buffer layer for making the substrate flat and blocking intrusion of impurity elements can be further provided on the upper surface of the transparent substrate 12. The buffer layer can be formed of $SiO_2$. Also, plastic material can also be used for the transparent substrate 12. For example, a polymer-based flexible type can be used therefor.

The first electrode layer 14 deposited on the transparent substrate 12 can be formed of a transparent conductive material (for example, indium tin oxide (ITO) or indium zinc oxide (IZO)). It can also be formed to be a predetermined pattern in a photolithography method. For a passive matrix (PM) display, the pattern of the first electrode layer 14 can be a plurality of lines in strips separated a predetermined distance from one another. For an active matrix (AM) display, a thin film transistor (TFT) layer having at least one thin film transistor can be further provided between the first electrode layer 14 and the transparent substrate 12. The first electrode layer 14 can be electrically connected to the TFT layer. Such a structure applies equally to all of the following embodiments (although the particular structure can vary).

The first electrode layer 14 formed of, for example, ITO can function as an anode electrode by being connected to an external first electrode port (not shown). The second electrode layer 16 can be disposed above the first electrode layer 14. The second electrode layer 16 can be a reflective electrode and can be formed of aluminum/calcium and connected to an external second electrode port (not shown) so as to function as a cathode electrode.

The second electrode layer 16 can be in the form of a plurality of lines in strips perpendicular to the pattern of the first electrode layer 14 (for a PM display) or in the form corresponding to a pixel (for an AM display). In the case of the AM display, the second electrode layer 16 can be formed as one body throughout the entire active area (the area for representing an image). The first electrode layer 14 and the second electrode layer 16 may have opposite polarities.

The intermediate layer 18 disposed between the first and second electrode layers 14 and 16 can include the light emitting layer 182. The light emitting layer 182 can emit light in response to the electrical driving of the first electrode layer 14 and the second electrode layer 16. An electroluminescence device can be an organic electroluminescence device or an inorganic electroluminescence device depending on the type of the intermediate layer 18. For the organic electroluminescence device, a small molecule or polymer organic substance can be used.

In the case of a small molecule organic layer in which the intermediate layer 18 is formed of a small molecule organic substance, a first intermediate layer 184 having a hole transport layer and hole injection layer in a direction toward the first electrode layer 14 and a second intermediate layer 186 having an electron transport layer and an electron injection layer in a direction toward the second electrode layer 16 can be provided with respect to the light emitting layer 182. The hole injection layer, the hole transport layer, the electron transport layer, and the electron injection layer can be deposited in a variety of complex structures. Other layers having different functions can also be formed.

Copper phthalocyanine (CuPc), N,N-Di(naphthalene-1-yl)-N,N'-diphenyl-benzidine (NPB), tris-8-hydroxyquinoline aluminum (Alq3), and the like can be used as the organic substance. For a full color organic electroluminescence device, the intermediate layer 18 can be formed in a variety of patterns to correspond to the color of each pixel. The small molecule organic layer can be formed by heating an organic substance in a vacuum to deposit it. The light emitting layer 182 can be formed by sequentially depositing a small molecule organic material for each color with a mask having a slit of a predetermined pattern to correspond to each pixel.

For a polymer organic layer formed of a polymer organic substance, only a hole transport layer (HTP) may be provided as a first intermediate layer 184 in a direction toward the first electrode layer 14 with respect to the light emitting layer 182. The second intermediate layer 186 can be omitted. The polymer hole transport layer can be formed on the upper surface of the first electrode layer 14 of the transparent substrate 12 in, for example, an inkjet printing or spin coating method using poly-(2,4)-ethylene-dihydroxy thiophene (PEDOT) or polyaniline (PANI). PPV, Soluble PPV's, Cyano-PPV, or polyfluorene can be used for the polymer organic light emitting layer. A color pattern can be formed in a typical method such as inkjet printing, spin coating, or thermal transfer method using a laser. In the polymer organic layer, the structure of the first and second intermediate layers 184 and 186 is not limited to the above and various layers can be formed as necessary or desired.

For the inorganic electroluminescence device, the light emitting layer 182 can be formed of metal sulfides such as ZnS, SrS, or CaS; alkaline earth potassium sulfides such as $CaGa_2S_4$ or $SrGa_2S_4$; or transition metal or alkaline earth metals including Mn, Ce, Th, Eu, Tm, Er, Pr, or Pb. The first and second intermediate layers 184 and 186 can be formed as insulating layers.

The embodiments of the present invention will be described based on the small molecule organic electroluminescence device.

The seal member (not shown) can be provided on the upper surface of the second electrode layer 16. The seal member can be a metal cap including a hygroscopic agent. Alternatively, it can be formed by coating a resin for sealing to protect intrusion of moisture therein. The seal member can be formed using a substrate.

In the flat panel display of the first embodiment of the present invention, the light emitting device is an electroluminescence device and is of a rear light emitting type in which light emitted from the light emitting layer 182 proceeds in a direction toward the substrate 12. However, the present invention is not so limited. It can be applied, for example, to a case in which the light emitting device is of a front light emitting type or not an electroluminescence device.

In the first embodiment of the present invention, the prism sheet 19 can be formed on the lower surface of the transparent substrate 12 and can be formed of a transparent glass material having $SiO_2$ as a main ingredient. It could alternatively be formed of a plastic material. The plastic material may be an acrylate-based or benzocyclobutene-based prism formed on a PET film. In addition, a plastic material having a refractive index of about 1.4 or more can be used for this embodiment.

In the flat panel display 10 of the first embodiment of the present invention, it may be desirable to adjust the thickness T12 from the light emitting layer 182 to a portion of the prism sheet 19 where the protruding members are not present. Because sharpness of an image is improved as the thickness T12 decreases, it may be better to decrease the thickness T12.

The thickness T12 includes the thickness T14 of the first intermediate layer 184, the thickness T16 of the first electrode layer 14, the thickness T18 of the transparent substrate 12, and the thickness T19 of a portion of the prism sheet 19 excluding the protruding member. The thickness T14 of the first intermediate layer 184 and the thickness T16 of the first electrode layer 14 may be not more than about 1 µm. The thickness T18 of the transparent substrate 12 and the thickness T19 of a portion of the prism sheet 19 excluding the protruding member may be at the thickest about several hundreds of µm and about 100 µm, respectively. Thus it is important to adjust the thickness T17 that is a sum of the thickness T18 of the transparent substrate 12 and the thickness T19 of a portion of the prism sheet 19 excluding the protruding member.

As described above, the distance between the overlapped images generated as the image formed by the light emitting layer 182 passes through the prism sheet 19 decreases as the thickness T12 from the light emitting layer 182 to the portion of the prism sheet 19 (excluding the protruding portions) is decreased. Thus, the sharpness of an image is improved as the thickness T17 decreases.

The size of a character frequently used in an organic electroluminescence device for mobile phones is about 12 points and the thickness of the transparent substrate can be about 0.7 mm. When a prism sheet having a thickness of 0.1 mm is attached to the substrate, the character may not appear to be clear. When the thickness of the substrate decreases to about 0.5 mm, the character appears to be clear. Since the width of the displayed character is about 200 µm, the sharpness of the character is determined based on how much the width of the character appears to be blur. That is, when a character having a width of 200 µm appears to be blurred over 400 µm, the character is illegible.

Figure 13:
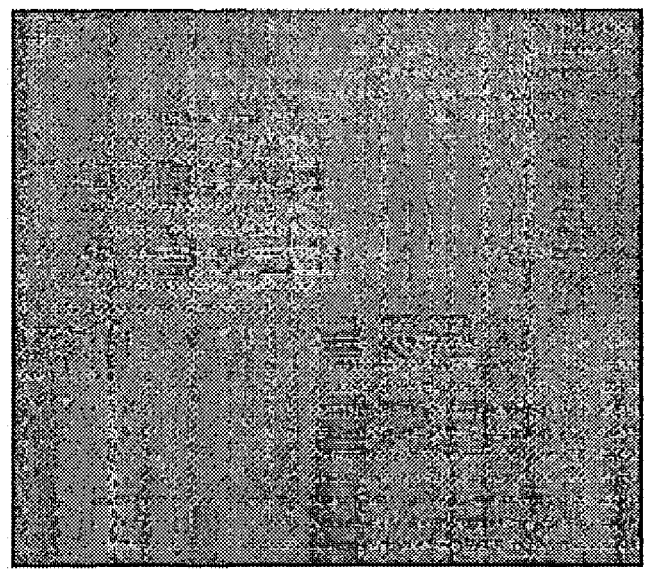
FIG. 13 is an image when the prism sheet is applied to a substrate having a thickness of 0.7 mm.
Figure 14:
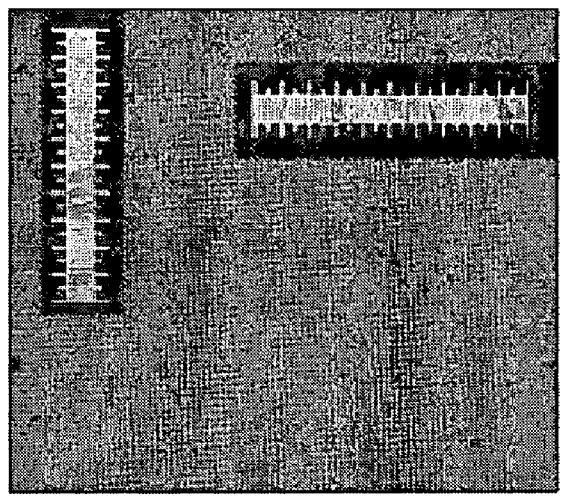
FIG. 14 is a microscopic image of a character when the prism sheet is applied to the substrate having a thickness of 0.7 mm.

As shown in FIGS. 5 through 12, when the prism sheet is applied to a substrate having a thickness of not more than about 0.5 mm, the width of a character is less than about 400 µm and appears to be blurred when viewed using a microscope, although the character can be recognized with the naked eye. However, as shown in FIGS. 13 and 14 in which the prism sheet is applied to the substrate having a thickness of 0.7 mm, the width of the character microscopically appears to be greater than about 800 µm and two characters appear to be overlapped when viewed with the naked eye. Thus, the thickness T17 is preferably about 0.5 mm or less.

Figure 15:
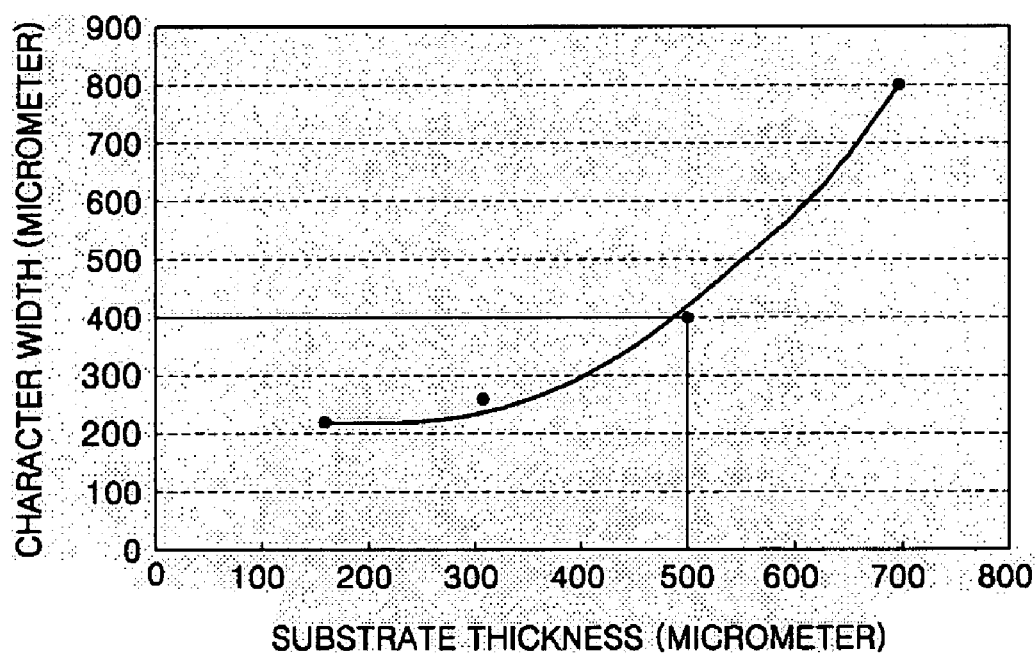
FIG. 15 is a graph showing the relationship between the thickness of the substrate and the width of the character.

FIG. 15 is a graph showing the relationship between the thickness of the substrate and the width of the character. It is not difficult to read a character with the naked eye when the width of the character is not more than about 400 µm. FIG. 15 shows that the thickness of the substrate corresponding thereto is about 0.5 mm or less. In particular, as shown in FIG. 15, when the thickness of the substrate is about 0.3 mm or less, the width of the character is not blurred more than about 50 µm. Thus, the thickness T17 is more preferably about 0.3 mm or less.

As the thickness T18 of the transparent substrate 12 decreases, the warp of the transparent substrate 12 can increase. Thus an alignment problem may occur. Accordingly, there may be a limit in reducing the thickness T18 of the transparent substrate 12 without significantly lowering yield. A lower limit of the thickness, given present manufacturing processes is about 0.05 mm, although future advances may decrease this amount.

Also, in the manufacture of the prism sheet 19, the lower limit of the thickness T19 without a significant decrease in yield is presently about 0.05 mm, although future advances may decrease this amount. As a result, the thickness T17 may be about 0.1 mm or more at its minimum, although future advances may decrease this amount. Thus, light coupling efficiency and brightness in a particular direction can be improved and sharpness can be maintained by installing the prism sheet under the above conditions.

Figure 16:
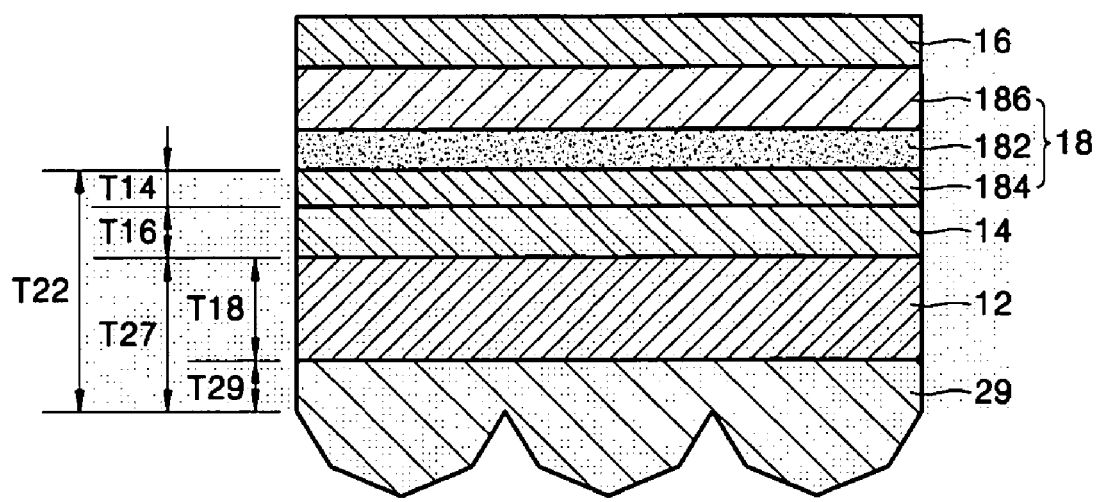
FIG. 16 is a cross-sectional view of a flat panel display of another embodiment of the present invention.

FIG. 16 is a cross-sectional view of a flat panel display 20 of a second embodiment of the present invention, in which the light emitting device is an organic electroluminescence device and the cross-section of the protruding member of the prism sheet 29 formed of a glass member is a polygon having the number of sides greater than that of a triangle. Thickness T29 may be a thickness of a portion of the prism sheet 29 where the protruding members are not present. Thickness T27 may be a thickness of the transparent substrate 12 and a portion of the prism sheet 29 where the protruding members are not present. Thickness T22 may be a thickness from the light emitting layer 182 to a portion of the prism sheet 29 where the protruding members are not present.

Figure 17:
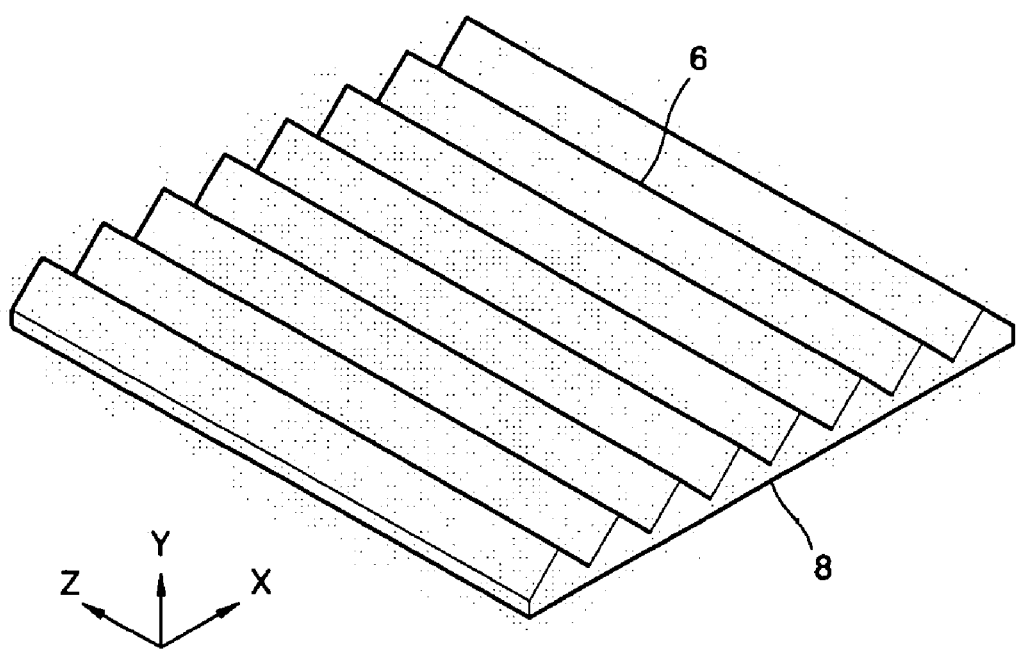
FIG. 17 is a perspective view of a triangular prism sheet.

FIG. 17 is a perspective view of a triangular prism sheet 4 having a conventional isosceles triangle structure. As shown in FIG. 17, a plurality of isosceles triangular prisms 6 can be arranged parallel to one another in a direction light exits. For example, if light exits in a Y-direction, the prisms may be arranged parallel along the X-direction. The opposite surface to a surface where the prisms 6 are formed may be a smooth surface 8. An inclined surface C2 (as shown in FIG. 18) of each prism 6 may have an angle about 45° with respect to a normal Y that is perpendicular to the smooth surface 8.

Figure 18:
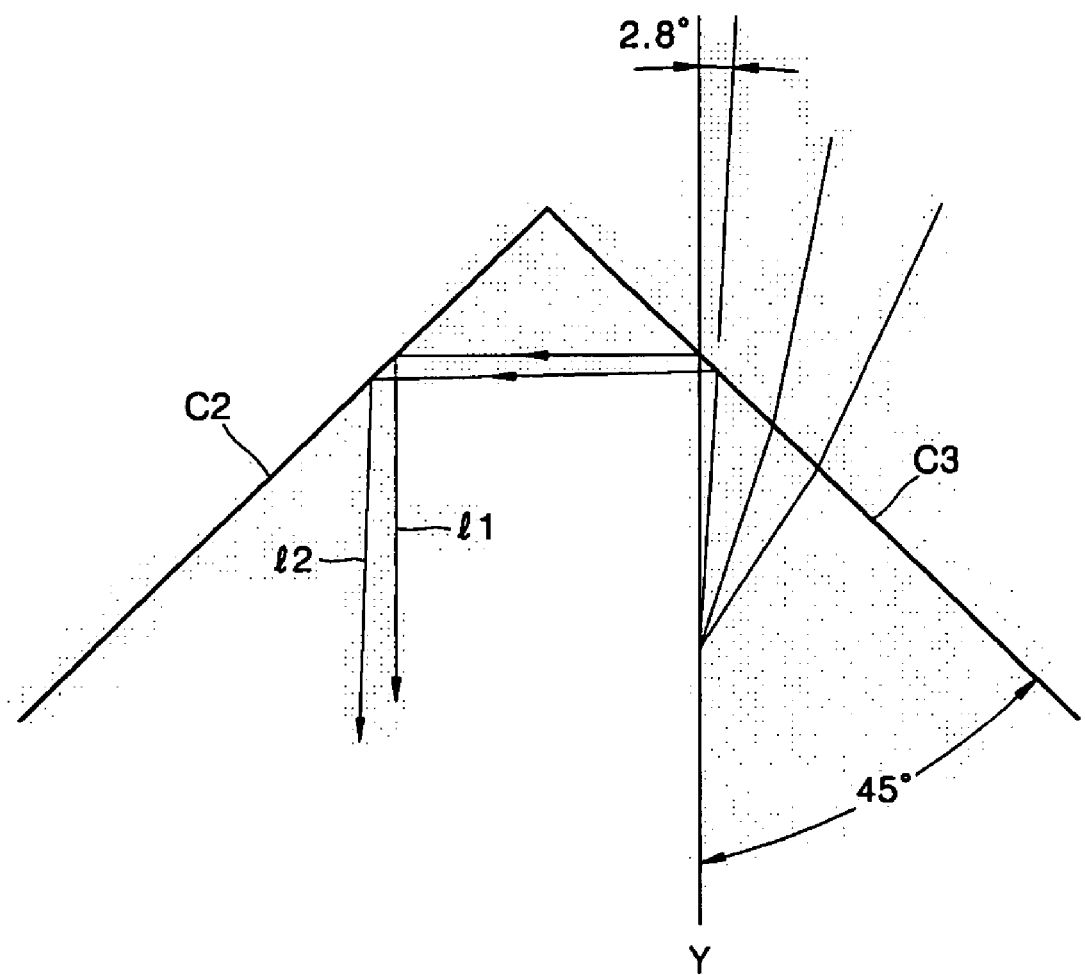
FIG. 18 is a cross-sectional view showing the operation of the triangular prism sheet of FIG. 17 for light incident on the right side of the prism.

In this case, as shown in FIG. 18, when light incident on the right inclined surface C3 through the inside of the prism sheet has an angle within about 2.8° with respect to the normal Y, the incident light is totally reflected along paths $\ell1$ and $\ell2$ and lost.

Figure 19:
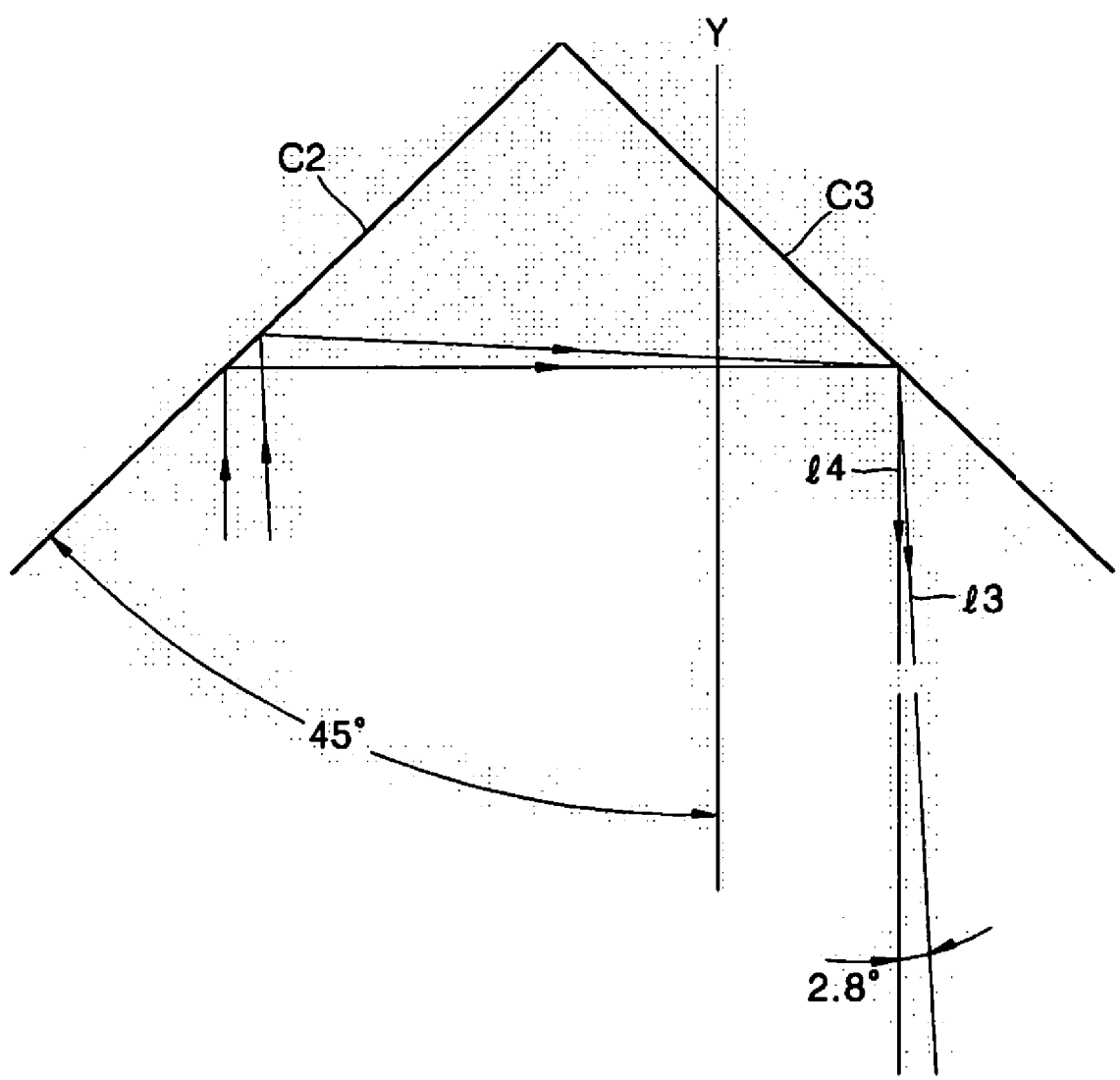
FIG. 19 is a cross-sectional view showing the operation of the triangular prism sheet of FIG. 17 for light incident on the left side of the prism.

Also, as shown in FIG. 19, when light incident on the left inclined surface C2 through the inside of the prism sheet has an angle within about 2.8° with respect to the normal Y, the incident light is totally reflected along paths 3 and 4 and lost.

Thus, when light incident on the inclined surface of the prism sheet has an angle within about 2.8° with respect to the normal Y, the efficiency of light deteriorates, and the front surface brightness improvement is impaired. Thus, there is a need to adjust the angle of each surface of the prism.

Figure 20:
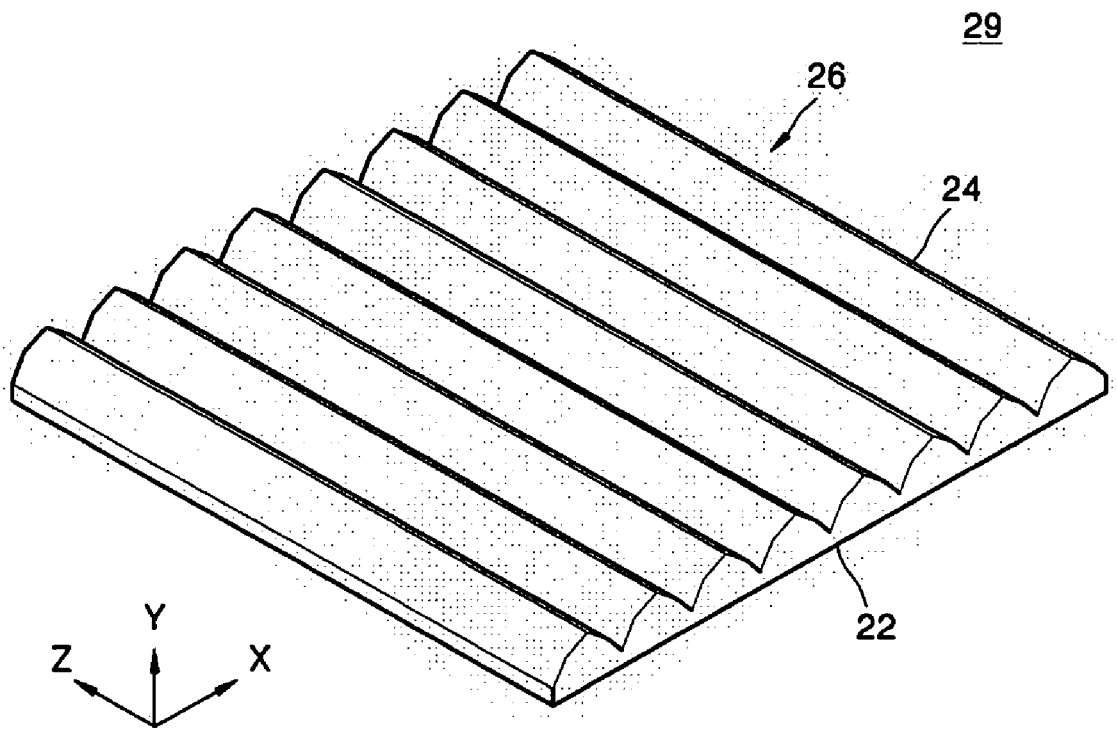
FIG. 20 is a perspective view of the prism sheet formed at the flat panel display of FIG. 16.
Figure 21:
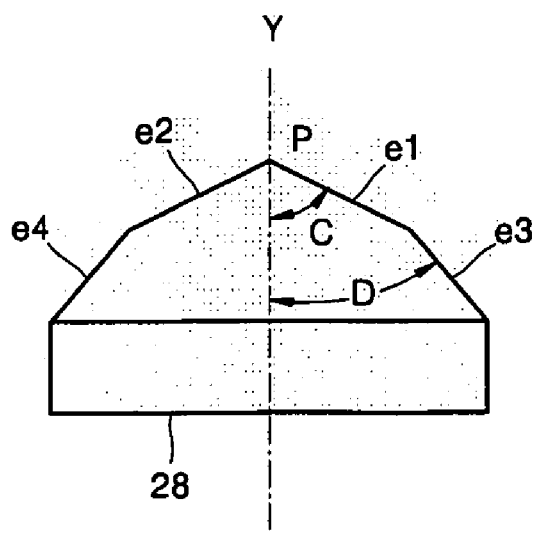
FIG. 21 is a cross-sectional view of one of protruding members of the prism sheet of FIG. 20.

FIG. 20 is a perspective view of the prism sheet 29 of FIG. 16. FIG. 21 is a cross-sectional view of one of the protruding members of the prism sheet 29 of FIG. 20. As shown in FIG. 20, the prism sheet 29 of the second embodiment of the present invention can include a first surface 22 on which light is incident and a second surface 24 disposed at the opposite side to the first surface 22 and having a plurality of protruding members 26 of a polygonal structure. The protruding members 26 may be arranged parallel to one another in a direction (for example, the X-direction).

The cross-section of the protruding members 26, as shown in FIG. 21, may be polygonal (for example, pentagonal, hexagonal, or having a greater number of sides). In the sectional structure shown in FIG. 21, each of two first sides e1 and e2 adjacent to the highest apex P has an angle C of about 65° to about 75° with respect to the normal Y of the first surface 28. This angle has an angle within about 2.8° with respect to the normal Y of the first surface 28 as described above. This angle corresponds to a range in which light incident on the inclined surfaces of each of the protruding members 26 exits without being totally reflected. Second sides e3 and e4 adjacent to the first sides e1 and e2, respectively, have an angle D of about 40° to about 60° with respect to the normal Y of the first surface 28. When the prism sheet 26 is used, the amount of light that is totally reflected in the prism can be reduced and the amount of light that exits can increase. Thus brightness can improve.

In the process of manufacturing the prism sheet 29 having the pentagonal protruding members shown in FIGS. 20 and 21, each protruding member can be formed in a variety of methods such as sand blast, laser hologram, or half tone methods. In this case, it may be efficient to form the first sides e1 and e2 (having an angle C of about 65° to about 75° with respect to the normal Y of the first surface 28 closer to the apex P of the protruding member) after the second sides e3 and e4 (having an angle of about 40° to about 60° with respect to the normal Y of the first surface 28).

The second sides e3 and e4 may be disposed closer to the first surface 28 of the prism sheet 29. Thus, the efficiency of the process may be improved if the first sides e1 and e2 are arranged closer to the highest apex P of the protruding member than the second sides e3 and e4.

In the prism sheet 29 there is a side that does not have the most favorable angle, and thus it is unavoidable that some light incident at an angle within 2.8° is partially reflected by the protruding surface of the prism sheet. Thus, when the section of the prism sheet is made to have a pentagonal structure, the total length of sides having an angle range of about 65° to about 75° with respect to the normal of the four sides closely connected to the apex may be formed to be as large as possible.

The above-described prism sheet may be formed of a glass member having a critical angle of about 42°. When the prism sheet is formed of a plastic member, the amount of totally reflected light may be reduced by adjusting the angle of each side of the protruding member according to the critical angle of the material in the same principle, so that brightness is improved.

Figure 22:
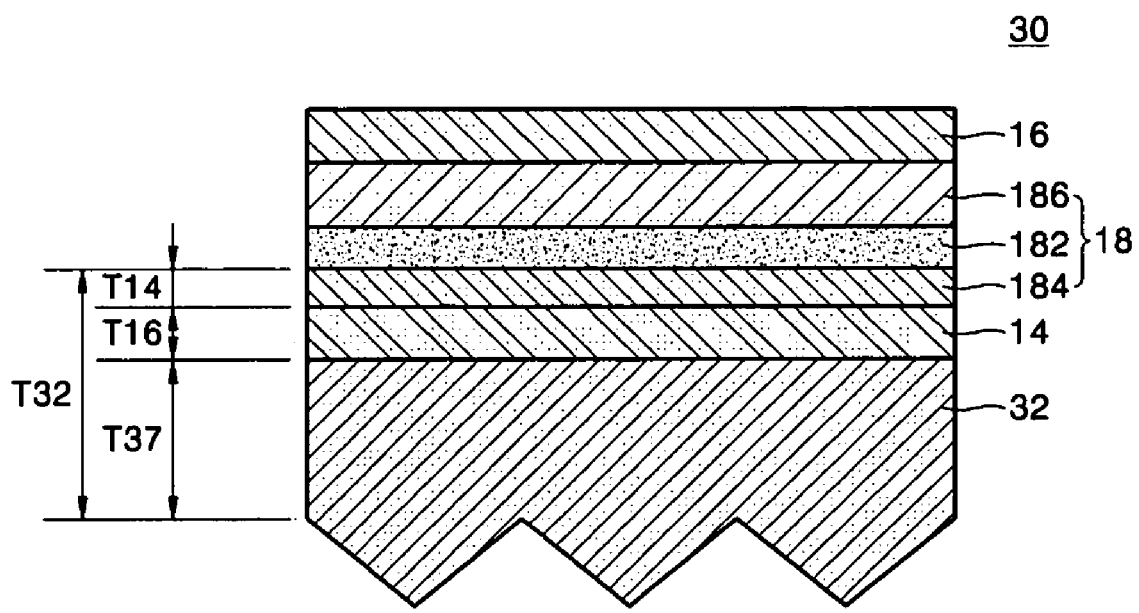
FIG. 22 is a cross-sectional view of a flat panel display of yet another embodiment of the present invention.

FIG. 22 is a cross-sectional view of a flat panel display 30 of a third embodiment of the present invention, in which a light emitting device can be an electroluminescence device and a prism sheet and transparent substrate can be integrally formed into one body 32. Thickness T32 may be a thickness from the light emitting layer 182 to a portion of the body 32 where the protruding members are not present. As shown in FIG. 22, when a transparent electrode is directly formed in the prism sheet and the prism sheet with the transparent electrode is used as a transparent substrate of the light emitting device, the prism sheet and the transparent substrate are integrally formed and the number of parts can be reduced. Thus the manufacturing process thereof can be simplified. Sharpness of an image can be improved by reducing the thickness T37 of a portion of the body 32 excluding the protruding member. Of course, in this case, the protruding member can be polygonal (for example, it can be a triangular pyramid, a pentagonal pyramid, or the like).

By limiting the thickness of the sum of the transparent substrate and a portion of the prism sheet excluding the protruding member to a predetermined thickness, the sharpness of an image passing through the prism sheet can be improved.

By forming the prism sheet on the transparent substrate, total reflection of light by the light emitting device can be reduced and light may be allowed to proceed in a predetermined direction. Thus light coupling efficiency and brightness may be improved. Accordingly, waste of power can be prevented and the light emitting device's longevity can be improved.

By adjusting the angle of each side of the protruding portion of the prism sheet, the amount of light totally reflected in the prism sheet can be reduced so that the amount of exit light is increased. Thus, light coupling efficiency and brightness can be improved.

By forming the transparent electrode directly in the prism sheet and using the same as the transparent substrate of the light emitting device, the prism sheet and the transparent substrate can be formed integrally and the number of parts can be reduced. Thus, the manufacturing process can be simplified.

While the present invention has been particularly shown and described with reference to exemplary embodiments thereof, various changes in form and details may be made to them without departing from the scope of the present invention.

What is claimed is:

1. A flat panel display comprising:
a light emitting device formed on a first surface of a transparent substrate; and
a prism sheet formed on a second surface of the transparent substrate and having a plurality of polygonal protruding members having lengthwise axes parallel to one another to direct light output from the light emitting device in a predetermined direction,
wherein a sum of a thickness of the transparent substrate and a thickness of a portion of the prism sheet excluding the polygonal protruding members is approximately between about 0.1 and about 0.5 mm.

2. The flat panel display of claim 1, wherein the sum of the thickness of the transparent substrate and the thickness of the portion of the prism sheet excluding the polygonal protruding members is approximately between about 0.1 to about 0.3 mm.

3. The flat panel display of claim 1, wherein the cross-section of the protruding members comprises a pentagon.

4. The flat panel display of claim 1, wherein the transparent substrate comprises glass or plastic.

5. The flat panel display of claim 1, wherein each of the protruding members has at least a first side forming an angle approximately between about 65° and about 75° with respect to a line perpendicular to the second surface of the transparent substrate.

6. The flat panel display of claim 5, wherein each of the protruding members has at least a second side adjacent to the first side and forming an angle approximately between about 40° to about 60° with respect to a line perpendicular to the second surface of the transparent substrate.

7. The flat panel display of claim 6, wherein the first side is closer to the highest apex of the protruding member than the second side.

8. The flat panel display of claim 6, wherein a total length of the first side is longer than a total length of the second side.

9. The flat panel display of claim 4, wherein the prism sheet is a glass material or a plastic material.

10. The flat panel display of claim 1, wherein the light emitting device is an electroluminescence device.

11. The flat panel display of claim 1, wherein the prism sheet and the transparent substrate are integrally formed.

* * * * *